United States Patent
Lee et al.

(10) Patent No.: US 11,776,588 B2
(45) Date of Patent: Oct. 3, 2023

(54) SENSE AMPLIFIER AND SEMICONDUCTOR MEMORY DEVICE INCLUDING THE SENSE AMPLIFIER

(71) Applicant: SAMSUNG ELECTRONICS CO., LTD., Suwon-si (KR)

(72) Inventors: Seok Jae Lee, Gwangmyeong-si (KR); Bok-Yeon Won, Namyangju-si (KR); Kyoung Min Kim, Namyangju-si (KR); Dong Geon Kim, Suwon-si (KR); Myeong Sik Ryu, Suwon-si (KR); In Seok Baek, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 43 days.

(21) Appl. No.: 17/465,429

(22) Filed: Sep. 2, 2021

(65) Prior Publication Data
US 2022/0139429 A1 May 5, 2022

(30) Foreign Application Priority Data
Nov. 3, 2020 (KR) .......................... 10-2020-0145306

(51) Int. Cl.
*G11C 7/06* (2006.01)
*G11C 5/06* (2006.01)
(Continued)

(52) U.S. Cl.
CPC ................ *G11C 7/062* (2013.01); *G11C 5/06* (2013.01); *G11C 7/10* (2013.01); *G11C 8/10* (2013.01); *G11C 11/4093* (2013.01)

(58) Field of Classification Search
CPC .................................. G11C 7/062; G11C 5/06
(Continued)

(56) References Cited

U.S. PATENT DOCUMENTS

| 6,046,950 A | * | 4/2000 | Kim ....................... G11C 7/065 365/205 |
| 6,545,323 B2 | | 4/2003 | Oowaki et al. |

(Continued)

FOREIGN PATENT DOCUMENTS

| KR | 2000-0013427 | 3/2000 |
| KR | 10-0843911 | 7/2008 |

*Primary Examiner* — Anthan Tran
(74) *Attorney, Agent, or Firm* — F. Chau & Associates, LLC

(57) ABSTRACT

A sense amplifier includes a bit line sense amplifier including a first transistor and a second transistor spaced apart from each other in a first direction, a second conductive line configured to electrically connect the first transistor to the second transistor and extending in the first direction and a local sense amplifier configured to at least partially overlap the second conductive line and disposed between the first transistor and the second transistor. The local sense amplifier includes an active region, a plurality of gate patterns at least partially extending in the first direction and disposed on the active region, a first contact disposed between the plurality of gate patterns and including a long side extending in the first direction and a short side extending in a second direction crossing the first direction and a first conductive line electrically connected to the first contact while overlapping the first contact in a plan view and including a first conductive region extending in the first direction.

17 Claims, 13 Drawing Sheets

(51) Int. Cl.
  *G11C 7/10*      (2006.01)
  *G11C 8/10*      (2006.01)
  *G11C 11/4093*   (2006.01)

(58) Field of Classification Search
  USPC .......................................................... 365/207
  See application file for complete search history.

(56) References Cited

U.S. PATENT DOCUMENTS

| | | |
|---|---|---|
| 6,867,994 B2 | 3/2005 | Tsukikawa |
| 7,242,627 B2 | 7/2007 | Mizuno et al. |
| 7,574,648 B2 | 8/2009 | Akiyama et al. |
| 7,593,282 B2 | 9/2009 | Hong et al. |
| 7,603,592 B2 | 10/2009 | Sekiguchi et al. |
| 7,660,141 B2 | 2/2010 | Chang |
| 7,990,973 B2 | 8/2011 | Kajigaya |
| 8,022,484 B2 | 9/2011 | Nobutoki et al. |
| 10,453,518 B1 | 10/2019 | Nagai |
| 10,692,565 B2 | 6/2020 | Kim et al. |
| 2016/0078919 A1* | 3/2016 | Han .................. G11C 5/02 365/207 |
| 2019/0189191 A1 | 6/2019 | Won et al. |

* cited by examiner

SENSE AMPLIFIER AND SEMICONDUCTOR MEMORY DEVICE INCLUDING THE SENSE AMPLIFIER

CROSS-REFERENCE TO RELATED APPLICATION

This U.S. non-provisional patent application claims priority under 35 U.S.C. § 119 to Korean Patent Application No. 10-2020-0145306 filed on Nov. 3, 2020 in the Korean Intellectual Property Office, the disclosure of which is incorporated by reference in its entirety herein.

1. TECHNICAL FIELD

The present disclosure relates to a sense amplifier and a semiconductor memory device including the sense amplifier.

2. DISCUSSION OF RELATED ART

With the development of the electronic industry, there is an ever increasing demand for electronic components that provide a large number of functions, operate at high speeds, and a have a minimal size. A semiconductor memory device is an example of one of these electronic components. The semiconductor memory device includes a memory cell and a peripheral circuit to drive the memory cell. The area of the peripheral circuit may be reduced to improve the integration density of the semiconductor memory device.

The peripheral circuit includes a sense amplifier for amplifying a voltage difference between a bit line BL and a complementary bit line BLB. As the integration density of the semiconductor memory device increases, the area of the sense amplifier decreases. Thus, an area of a contact in the sense amplifier also decreases. However, the decrease in the area of the contact causes a deterioration in the performance of the semiconductor memory device.

SUMMARY

At least one embodiment of the present disclosure provide a sense amplifier whose operation performance is improved by increasing the area of the contact in an active region.

At least one embodiment of the present disclosure also provides a sense amplifier in which the direction in which a gate pattern extends and the direction in which a conductive line disposed on the gate pattern extends coincide with each other.

According to an exemplary embodiment, a sense amplifier includes a bit line sense amplifier including a first transistor and a second transistor spaced apart from each other in a first direction, a second conductive line configured to electrically connect the first transistor to the second transistor and extending in the first direction and a local sense amplifier configured to at least partially overlap the second conductive line and disposed between the first transistor and the second transistor. The local sense amplifier includes an active region, a plurality of gate patterns at least partially extending in the first direction and disposed on the active region, a first contact disposed between the plurality of gate patterns and including a long side extending in the first direction and a short side extending in a second direction crossing the first direction and a first conductive line electrically connected to the first contact while overlapping the first contact in a plan view and including a first conductive region extending in the first direction.

According to an exemplary embodiment, a semiconductor memory device includes a memory cell array including a plurality of memory cells, a bit line sense amplifier including a first transistor and a second transistor configured to sense a potential difference between a bit line and a complementary bit line during a sensing operation for the plurality of memory cells, an active region crossed by a second conductive line electrically connecting the first transistor to the second transistor, a gate pattern at least partially overlapping the second conductive line in plan view and extending in a first direction in which the second conductive line extends, a first conductive line extending in the first direction without at least partially overlapping the gate pattern and the second conductive line and a first contact overlapping the first conductive line and including a long side extending in the first direction and a short side extending in a second direction crossing the first direction.

According to an exemplary embodiment, a semiconductor memory device includes a memory cell array including a plurality of memory cells configured to store data, a bit line sense amplifier including a first transistor and a second transistor configured to sense a potential difference between a first potential of a bit line and a second potential of a complementary bit line during a sensing operation for the plurality of memory cells, a local sense amplifier configured to receive the first potential and the second potential from the bit line sense amplifier and provide data to a global input/output line. The local sense amplifier is disposed between the first transistor and the second transistor. The local sense amplifier includes an active region, a plurality of gate patterns disposed on the active region so as to at least partially overlap a second conductive line electrically connecting the first transistor to the second transistor, a first contact disposed between the plurality of gate patterns and including a long side extending in a first direction in which the second conductive line extends and a short side extending in a second direction crossing the first direction and a first conductive line electrically connected to the first contact while overlapping the first contact in a plan view and including a first conductive region extending in the first direction.

BRIEF DESCRIPTION OF THE DRAWINGS

The present disclosure will become more apparent by describing in detail exemplary embodiments thereof with reference to the attached drawings, in which.

DETAILED DESCRIPTION OF THE EXEMPLARY EMBODIMENTS

Hereinafter, embodiments of the present disclosure will be described with reference to the accompanying drawings. In the following description made with reference to FIGS. 1 to 13, the same reference numbers are used to refer to substantially the same components, and a redundant description of the corresponding components will be omitted. Like reference numbers refer to like elements throughout the various drawings.

Figure 1:
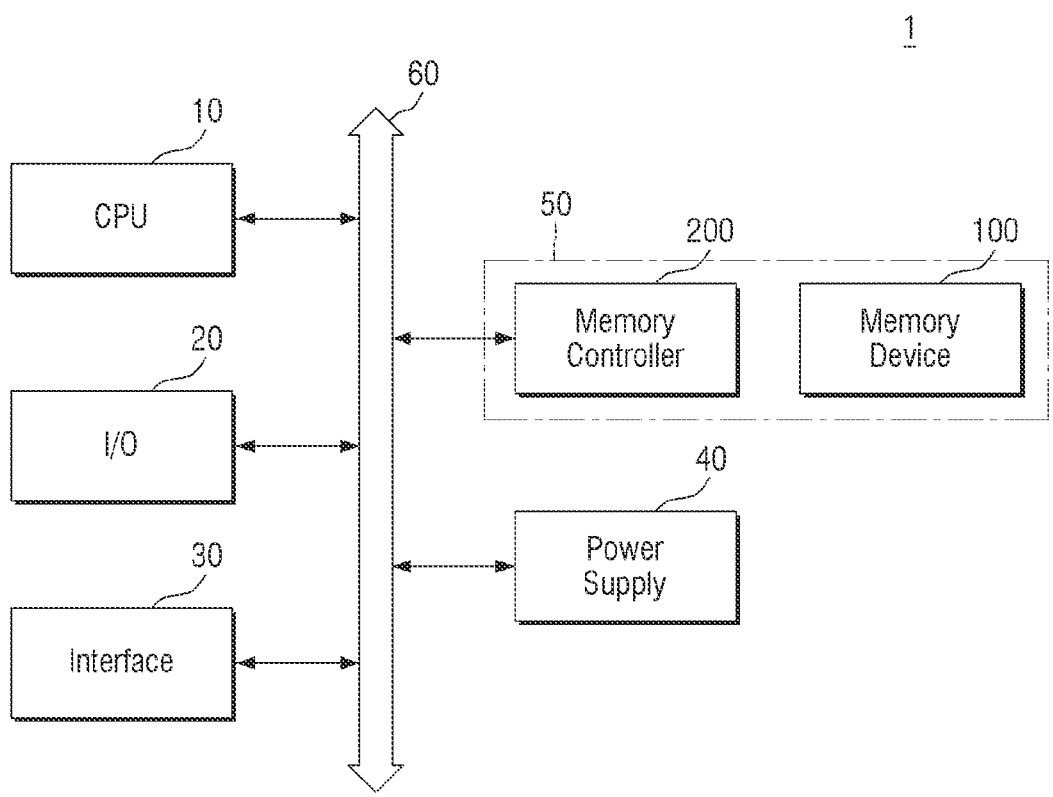
FIG. 1 is a block diagram illustrating a computing system including a semiconductor memory device according to an exemplary embodiment of the present disclosure.

FIG. 1 is a block diagram illustrating a computing system including a semiconductor memory device according to an exemplary embodiment of the present disclosure.

Referring to FIG. 1, the computing system 1 includes a central processing unit (CPU) 10, an input/output device (I/O) 20, an interface device (INTERFACE) 30, a power supply device (POWER SUPPLY) 40, and a memory system 50.

The central processing unit 10, the input/output device 20, the interface device 30, the power supply device 40, and the memory system 50 may be connected to each other by a bus 60. The bus 60 corresponds to a path through which data is transferred.

The central processing unit 10 may include a single processor core (single core) or multiple processor cores (multi-core) to process data. For example, the central processing unit 10 may include the multi-core such as a dual-core, a quad-core, a hexa-core, or the like. The central processing unit 10 may further include therein various hardware devices (e.g., IP core). The central processing unit 10 may include a cache memory disposed inside or outside the central processing unit 10.

The input/output device 20 may include one or more input devices such as a keypad and a touch screen, and/or one or more output devices such as a speaker and a display device.

The interface device 30 may perform wireless communication or wired communication with an external device. For example, the interface device 30 may perform Ethernet communication, near field communication (NFC), radio frequency identification (RFID) communication, mobile telecommunication, memory card communication, universal serial bus (USB) communication, or the like.

The memory system 50 may store data processed by the central processing unit 10 or may be driven as a working memory of the central processing unit 10. In an embodiment, the memory system 50 includes a memory device 100 and a memory controller 200. The configurations of the memory device 100 and the memory controller 200 may be substantially the same as those of the memory device 100 and the memory controller 200 to be described with reference to FIG. 2, and a detailed description thereof will be given later with reference to FIG. 2.

The power supply device 40 may convert a power inputted from the outside and provide it to the respective components 10 to 50. For example, the power supply device 40 may convert power from an alternating current (AC) power source into direct current (DC) voltage for use by the respective components 10 to 50.

Although not shown, the computing system 1 may further include a nonvolatile memory device. Examples of the nonvolatile memory device may include a read only memory (ROM), a programmable ROM (PROM), an electrically erasable programmable ROM (EEPROM), a flash memory, a phase-change RAM (PRAM), a resistive RAM (RRAM), a ferroelectric RAM (FRAM), and the like.

According to an embodiment, the computing system 1 may be any computing system such as a mobile phone, a smart phone, a personal digital assistant (PDA), a portable multimedia player (PMP), a digital camera, a music player, a portable game console, a navigation system, and the like.

The steps of a method or an algorithm described in relation with the embodiments of the present disclosure may be directly implemented using a hardware module, a software module, or a combination thereof executed by a processor such as the central processing unit 10. The software module may be permanently installed on a RAM memory, a flash memory, a ROM memory, an EPROM memory, an EEPROM memory, a register, a hard disk, a detachable disk, a CD-ROM, or any computer-readable storage medium known in the technical field of the present disclosure. A storage medium may be connected to the processor, so that it is possible to read information from the processor and write information in the storage medium. Alternatively, the storage medium may be integrally formed with the processor. The processor and the storage medium may be permanently mounted in an application specific integrated circuit (ASIC). The ASIC may be permanently mounted in a user terminal. Alternatively, the processor and the storage medium may be permanently mounted as separate components in a user terminal.

Figure 2:
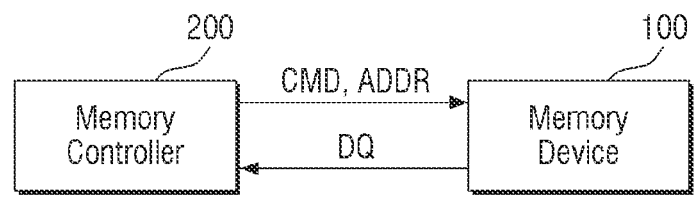
FIG. 2 is a block diagram illustrating a memory system including a semiconductor memory device according to an exemplary embodiment of the present disclosure.

FIG. 2 is a block diagram illustrating a memory system including a semiconductor memory device according to an exemplary embodiment of the present disclosure.

Referring to FIG. 2, the memory system includes the semiconductor memory device (memory device) 100, and the memory controller 200.

The memory controller 200 is configured to control the semiconductor memory device 100. The memory controller 200 may access the semiconductor memory device 100 in response to a request from a host. For example, the memory controller 200 may write data to the semiconductor memory device 100 or read data from the semiconductor memory device 100 in response to the request.

Therefore, the memory controller 200 may provide a command CMD and an address ADDR to the semiconductor memory device 100 and exchange data DQ with the semiconductor memory device 100. The memory controller 200 may be configured to drive firmware for controlling the semiconductor memory device 100.

The semiconductor memory device 100 is configured to store data. For example, the memory device 100 may be a DRAM such as a double data rate static DRAM (DDR SDRAM), a single data rate SDRAM (SDR SDRAM), a low power DDR SDRAM (LPDDR SDRAM), a low power SDR SDRAM (LPSDR SDRAM), and a direct Rambus DRAM (RDRAM), or any volatile memory device.

Figure 3:
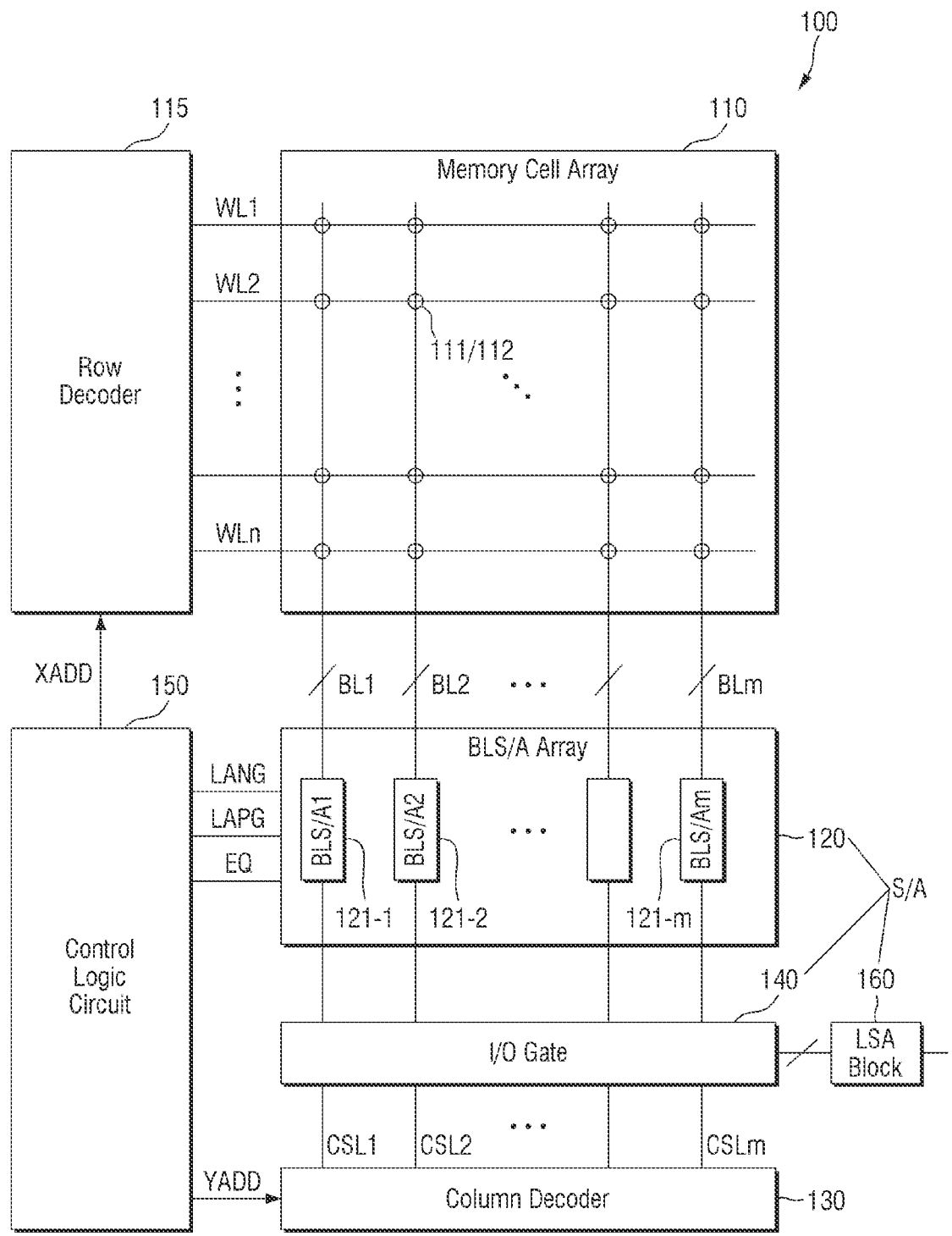
FIG. 3 is a block diagram of a semiconductor memory device according to an exemplary embodiment of the present disclosure.

FIG. 3 is a block diagram of a semiconductor memory device according to an exemplary embodiment of the present disclosure.

Referring to FIG. 3, the semiconductor memory device 100 includes a memory cell array 110, a row decoder 115 (e.g., a decoder circuit), a bit line sense amplifier array 120, a column decoder 130 (e.g., a decoder circuit), an input/output (I/O) gate 140, a control logic circuit 150, and a local sense amplifier (LSA) 160 or a LSA block.

The memory cell array 110 includes a plurality of memory cells 111 arranged in a matrix shape of rows and columns. The memory cells 111 are connected to word lines WL1 to WLn (n being a natural number) and bit lines BL1 to BLm (m being a natural number). The memory cells 111 may be classified into normal memory cells and redundant memory cells. When the normal memory cells are defective, the redundant memory cells are used to repair the defective normal memory cells. Each of the bit lines BL1 to BLm includes a bit line (e.g., a non-complementary bit line) and a complementary bit line.

The memory cell 111 may be implemented as a volatile memory cell or a nonvolatile memory cell. The volatile memory may be a dynamic random access memory (DRAM), a static random access memory (SRAM), a thyristor RAM (TRAM), a zero capacitor RAM (Z-RAM), or a twin transistor RAM (TTRAM).

The nonvolatile memory may be an electrically erasable programmable read-only memory (EEPROM), a flash memory, a magnetic RAM (MRAM), a spin-transfer torque MRAM, a conductive bridging RAM (CBRAM), a ferroelectric RAM (FeRAM), a phase change RAM (PRAM), a resistive RAM (RRAM), a nanotube RRAM, a polymer RAM (PoRAM), a nano floating gate memory (NFGM), a holographic memory, a molecular electronics memory device, or an insulator resistance change memory. The nonvolatile memory cell may store one or more bits.

The row decoder 115 decodes a row address XADD to activate a corresponding word line among the word lines WL1 to WLn. A high source voltage VPP higher than a source voltage VDD may be applied to a gate of an access transistor of the memory cell 111 during the activation of the word line. The activation of the word line may occur during an enable operation of the word line.

The bit line sense amplifier array 120 includes bit line sense amplifiers 121-1 to 121-m arranged in an array, a row, or a column. Each of the bit line sense amplifiers 121-1 to 121-m senses and amplifies data outputted from a corresponding memory cell 111. Any bit line sense amplifier may be connected to a bit line pair including a bit line and a complementary bit line to sense and amplify the potential of the bit line.

The bit line BL1 may mean the bit line pair, and the bit line pair may be implemented as a folded bit line sense amplifier type, or an open bit line sense amplifier type. However, embodiments of the inventive concept are not limited thereto. In the case of the open bit line sense amplifier type, another memory cell array separated from the memory cell array 110 of FIG. 3 may be disposed to face the memory cell array 110 of FIG. 3 with respect to the bit line sense amplifier. Each of the bit line sense amplifiers 121-1 to 121-m may be a cross-coupled differential sense amplifier implemented as a P-type sense amplifier and an N-type sense amplifier.

The bit line sense amplifiers 121-1 to 121-m, which are circuit elements operating normally during the operation of the semiconductor memory device, are distinguished from dummy sense amplifiers implemented in an area other than the area where the bit line sense amplifier array 120 is implemented.

The column decoder 130 may decode a column address YADD to generate column select signals CSL1 to CSLm.

In an embodiment, column select transistors in the input/output gate 140 transfer the potentials (e.g., voltages) outputted from the bit line sense amplifiers 121-1 to 121-m to local sense amplifiers in the local sense amplifier 160 in response to the column select signals CSL1 to CSLm.

In other words, a column select transistor pair is connected to the bit line pair, and drives the potential outputted from the corresponding sense amplifier and transfers it to the input terminal pair of the corresponding local sense amplifier 160.

The bit line sense amplifier array 120, the input/output gate 140, and the local sense amplifier 160 may form a sense amplifier S/A for the memory cell array 110.

The control logic circuit 150 may receive a command, an address, and write data from the processor or the memory controller 200. The control logic circuit 150 may generate various control signals (XADD, YADD, LANG, LAPG, EQ, and the like) required for an access operation, e.g., a write operation or a read operation, for the memory cell array 110 in response to the command and the address.

Figure 4:
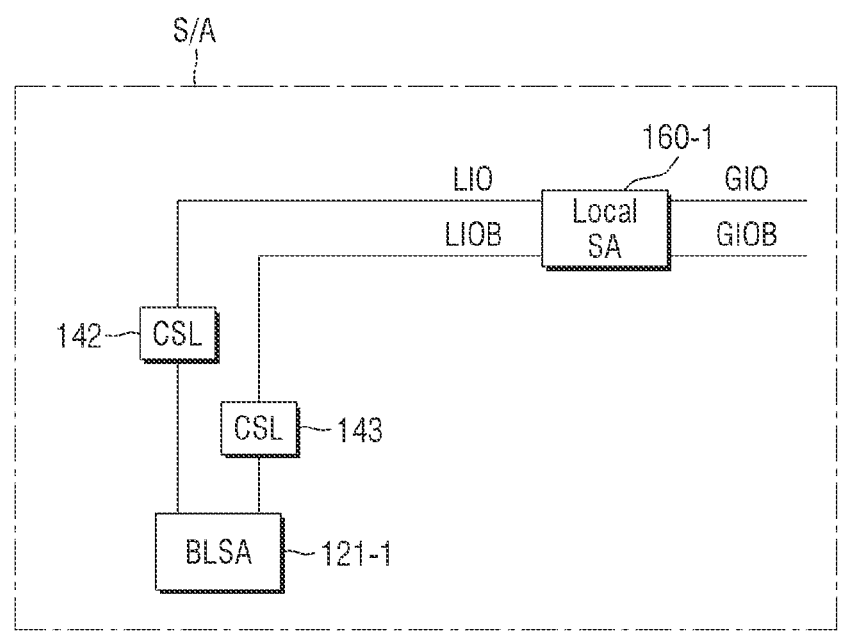
FIG. 4 shows an example of data output paths of the bit line sense amplifier and the local sense amplifier of FIG. 3.

FIG. 4 shows an example of data output paths of the bit line sense amplifier 120 and the local sense amplifier 160 of FIG. 3.

Referring to FIG. 4, a local sense amplifier 160-1 amplifies the potential difference received from a local input/output line pair LIO and LIOB and outputs it to a global input/output line pair GIO and GIOB. The global input/output line pair GIO and GIOB is connected to an input/output buffer that buffers data input/output, so that the local sense amplifier 160-1 may provide data stored in the memory cell to the input/output buffer through the global input/output line pair GIO and GIOB.

The bit line pair connected to the bit sense amplifier 121-1 is connected to the local input/output line pair LIO and LIOB through a column select transistor pair. A first column select transistor 142 forming a transistor of the column select transistor pair electrically connects the bit line BL to the local input/output line LIO. A second column select transistor 143 forming a transistor of the column select transistor pair electrically connects the complementary bit line BLB to the complementary local input/output line LIOB.

Figure 5:
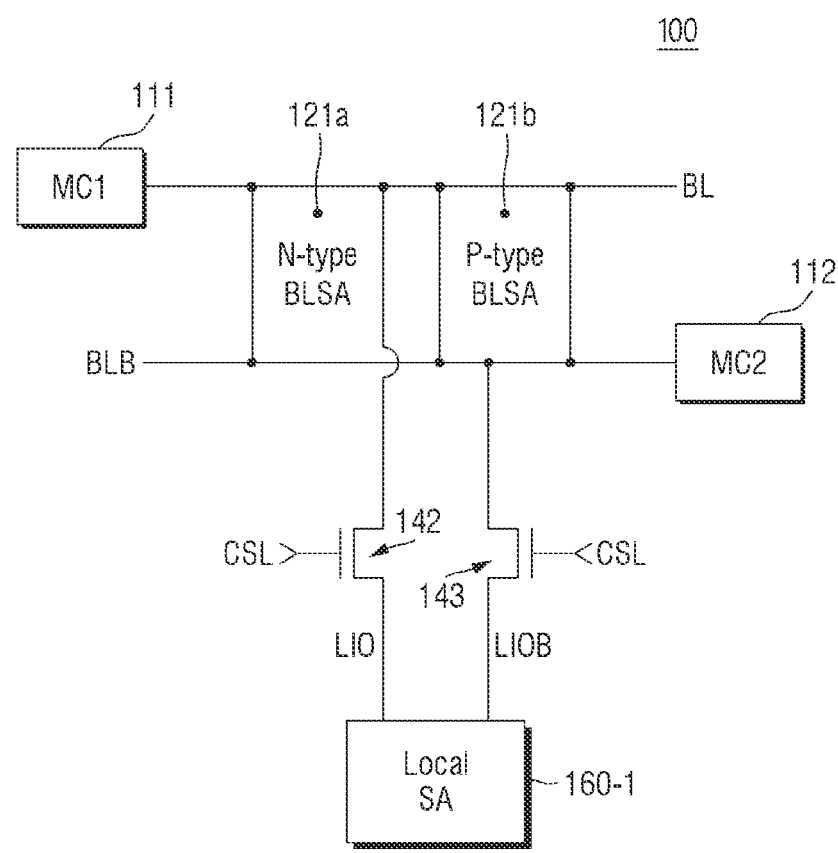
FIG. 5 shows an example of the arrangement structure of the sense amplifier according to an embodiment of the present disclosure.

FIG. 5 shows an example of the arrangement structure of the sense amplifier according to an exemplary embodiment of the present disclosure.

Referring to FIG. 5, the bit line sense amplifier includes an N-type sense amplifier 121a and a P-type sense amplifier 121b. The first and second column select transistors 142 and 143 may be N-type MOS transistors, and may be driven by a column select signal CSL.

Although not specifically shown, the semiconductor memory device 100 may include a pre-charge and equalization unit (e.g., a circuit) for pre-charging the bit line pair between the first memory cell 111 and the N-type sense amplifier 121a and between a second memory cell 112 and the P-type sense amplifier 121b to a pre-charge voltage and equalizing the bit line pair to the same potential.

In the bit line structure of FIG. 5, when the first memory cell 111 is accessed, the second memory cell 112 is not accessed. In the sensing operation of the bit line sense amplifier, when the potential of the bit line BL is high, the potential of the complementary bit line BLB is low. On the other hand, in the sensing operation of the bit line sense amplifier, when the potential of the bit line BL is low, the potential of the complementary bit line BLB is high.

Figure 6:
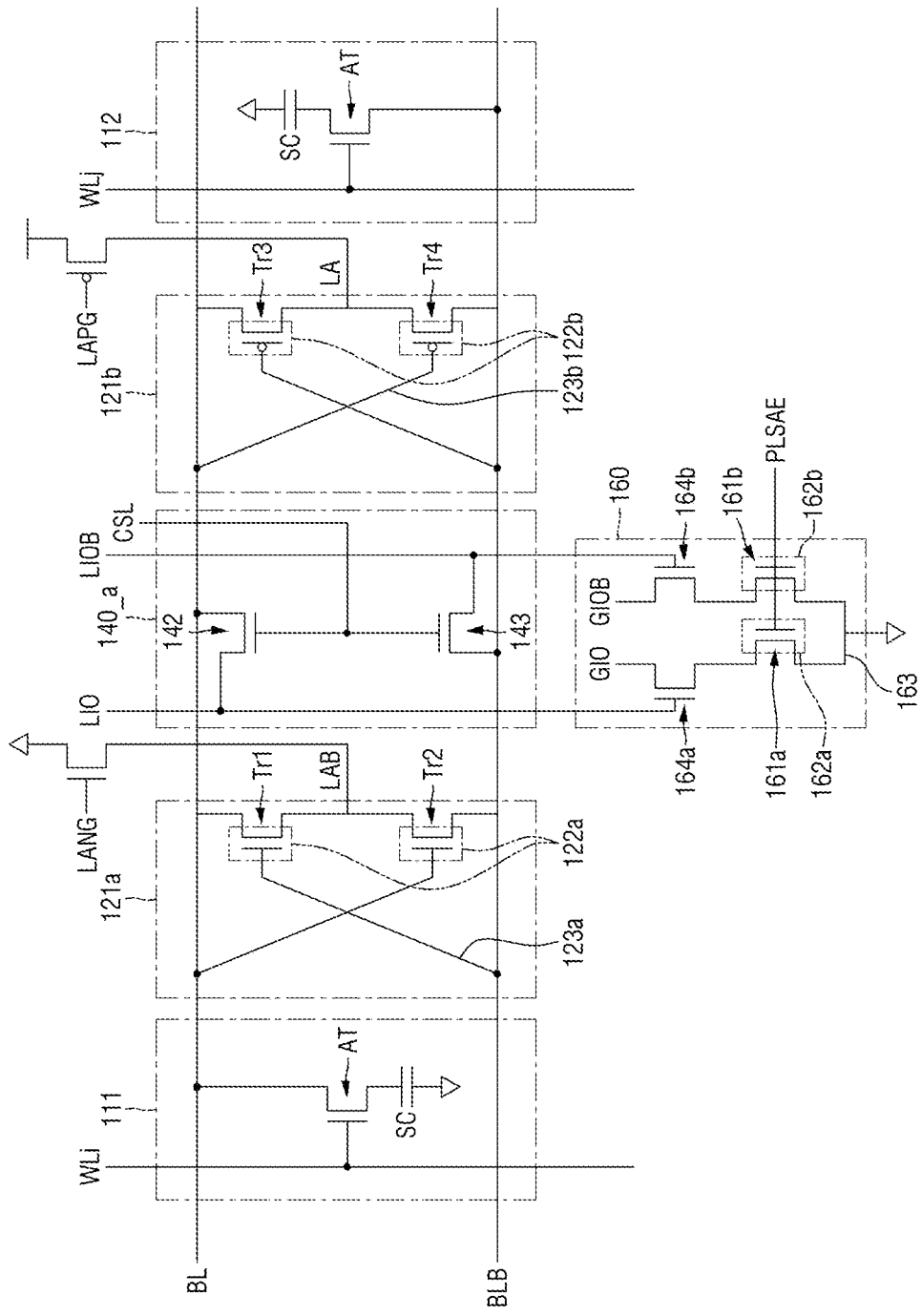
FIG. 6 is an exemplary circuit diagram illustrating a sense amplifier of FIG. 5.

FIG. 6 is an exemplary circuit diagram illustrating a sense amplifier of FIG. 5 according to an exemplary embodiment.

Referring to FIGS. 4 to 6, the sense amplifier S/A includes the N-type sense amplifier 121a, the P-type sense amplifier 121b, an input/output gate 140_a, and the local sense amplifier 160.

In an embodiment, the N-type sense amplifier 121a includes a first transistor Tr1 and a second transistor Tr2. The first transistor Tr1 and the second transistor Tr2 may be connected in series between the bit line BL and the complementary bit line BLB by conductive lines 123a. For example, the first transistor Tr1 and the second transistor Tr2 may be N-type transistors. In an embodiment, the source of the first transistor Tr1 and the source of the second transistor Tr2 are electrically connected to the bit line BL and the complementary bit line BLB, respectively. A first amplification voltage LAB is inputted to the drain of the first transistor Tr1 and the drain of the second transistor Tr2 in response to an N-type sense amplifier driving signal LANG. For example, a ground voltage Vss may be used as the first amplification voltage LAB. Gates 122a of the first transistor Tr1 and the second transistor Tr2 are electrically connected to the complementary bit line BLB and the bit line BL by the conductive lines 123a, respectively. The N-type sense amplifier 121a may provide the first amplification voltage LAB to the bit line BL or the complementary bit line BLB depending on voltage changes of the bit line BL or the complementary bit line BLB.

In an embodiment, the P-type sense amplifier 121b includes a third transistor Tr3 and a fourth transistor Tr4. The third transistor Tr3 and the fourth transistor Tr4 may be connected in series between the bit line BL and the complementary bit line BLB by conductive lines 123b. For example, the third transistor Tr3 and the fourth transistor Tr4 may be P-type transistors. In an embodiment, the source of the third transistor Tr3 and the source of the fourth transistor Tr4 are electrically connected to the bit line BL and the complementary bit line BLB, respectively. A second amplification voltage LA is inputted to the drain of the third transistor Tr3 and the drain of the fourth transistor Tr4 in response to a P-type sense amplifier driving signal LAPG. For example, a source voltage Vpp may be used as the second amplification voltage LA. In an embodiment, the ground voltage Vss is less than the source voltage Vpp. Gates 122b of the third transistor Tr3 and the fourth transistor Tr4 are electrically connected to the complementary bit line BLB and the bit line BL, respectively. The P-type sense amplifier 121b may provide the second amplification voltage LA to the bit line BL or the complementary bit line BLB depending on voltage changes of the bit line BL or the complementary bit line BLB.

In an embodiment, the input/output gate 140_a includes a first column select transistor 142 and a second column select transistor 143. The drain of the first column select transistor 142 and the drain of the second column select transistor 143 are electrically connected to the bit line BL and the complementary bit line BLB, respectively. The source of the first column select transistor 142 is electrically connected to the local input/output line LIO, and the source of the second column select transistor 143 is electrically connected to the complementary local input/output line LIOB. The column select signal CSL is inputted to the gate of the first column select transistor 142 and the gate of the second column select transistor 143.

In an embodiment, the local sense amplifier 160 includes a first NMOS transistor 161a, a second NMOS transistor 161b, a third NMOS transistor 164a and a fourth NMOS transistor 164b. Although NMOS transistors are illustrated in the present disclosure, this is an example and the local sense amplifier 160 is not limited to using a certain type of transistor.

The first NMOS transistor 161a, the second NMOS transistor 161b, the third NMOS transistor 164a, and the fourth NMOS transistor 164b may be electrically connected in the local sense amplifier 160 by a conductive line 163.

A local enable signal PLSAE is provided to a gate 162a of the first NMOS transistor 161a and a gate 162b of the second NMOS transistor 161b. The local sense amplifier 160 may be activated by the local enable signal PLSAE.

When the local sense amplifier 160 is activated by the local enable signal PLSAE, the third NMOS transistor 164a and the fourth NMOS transistor 164b may invert and output data of the local input/output line pair GIO and GIOB to the global input/output line pair LIO and LIOB, respectively.

The semiconductor memory device 100 may operate as follows. First, when word lines WLi and WLj are activated, switching transistors AT of the memory cells 111 and 112 are turned on and charges move between the bit line BL or the complementary bit line BLB and storage capacitors SC. Then, the N-type sense amplifier 121a or the P-type sense amplifier 121b amplify the potential difference between the bit line BL and the complementary bit line BLB. Then, when the column select signal CSL reaches a first level, the input/output gate 140_a outputs data of the bit line BL or the complementary bit line BLB through the local input/output line LIO or the complementary local input/output line LIOB.

The local sense amplifier 160 may invert output data of the local input/output line pair LIO and LIOB and output the inverted data to the global input/output line pair GIO and GIOB based on the local enable signal PLSAE, respectively.

Although not shown, a pre-charge and equalization unit may be present to equalize voltages of the bit line BL and the complementary bit line BLB to the pre-charge voltage before and after the operation of the sense amplifier S/A.

Figure 7:
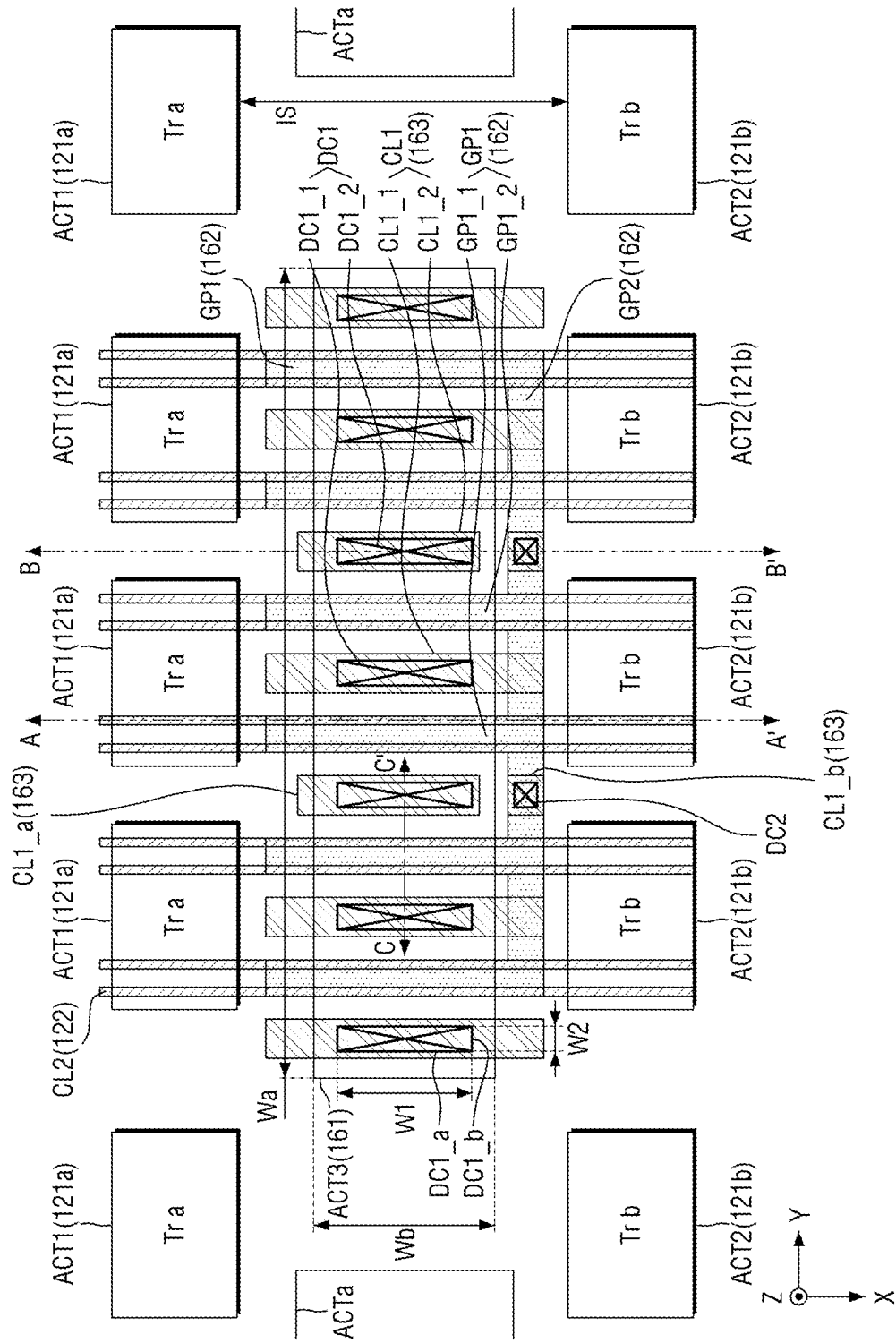
FIG. 7 is a layout diagram illustrating a sense amplifier according to an exemplary embodiment of the present disclosure.
Figure 8:
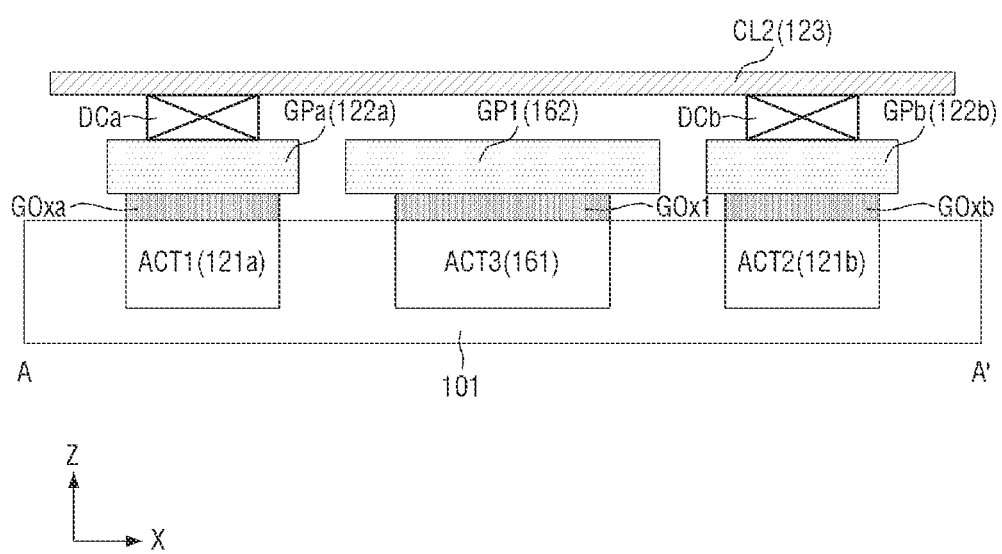
FIG. 8 is a diagram for explaining a cross section taken along line A-A' of FIG. 7.
Figure 9:
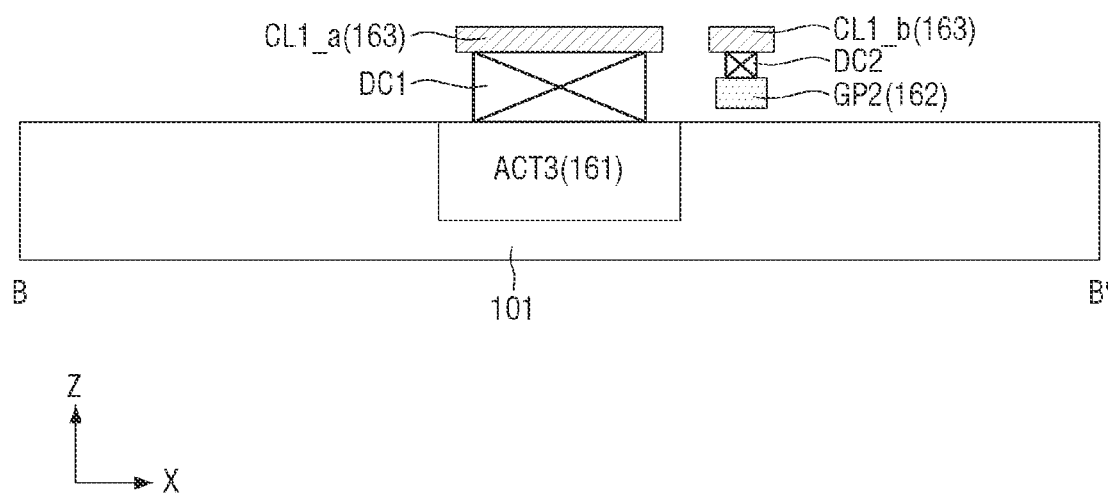
FIG. 9 is a diagram for explaining a cross section taken along line B-B' of FIG. 7.
Figure 10:
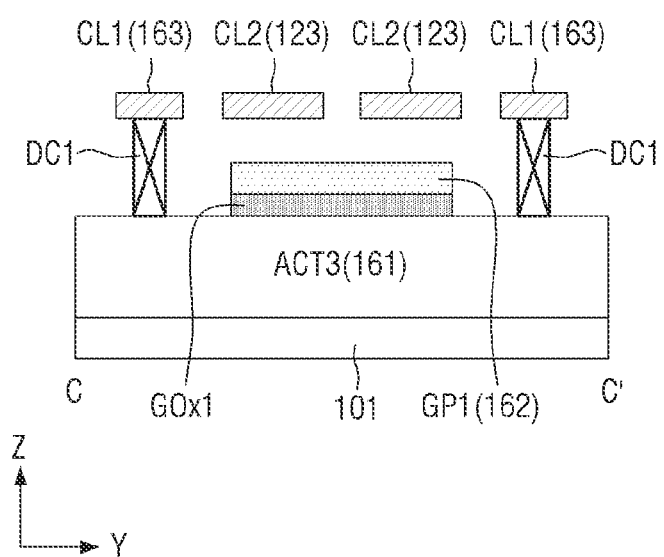
FIG. 10 is a diagram for explaining a cross section taken along line C-C' of FIG. 7.

FIG. 7 is a layout diagram illustrating a sense amplifier according to an exemplary embodiment of the present disclosure. FIG. 8 is a diagram for explaining a cross section taken along line A-A' of FIG. 7. FIG. 9 is a diagram for explaining a cross section taken along line B-B' of FIG. 7. FIG. 10 is a diagram for explaining a cross section taken along line C-C' of FIG. 7.

Referring to FIGS. 7 to 9, the sense amplifier S/A includes, on a substrate 101, a plurality of first active regions ACT1, a plurality of second active regions ACT2, and a third active region ACT3, an adjacent active region ACTa, a plurality of first gate patterns GP1, a second gate pattern GP2, a first conductive line CL1, a second conductive line CL2, a first contact DC1, and a second contact DC2. In embodiment, each of the first conductive line CL1, a second conductive line CL2, a first contact DC1, and a second contact DC2 includes a conductive material.

In an embodiment, the plurality of first active regions ACT1 is arranged in a row in a second direction Y, and the plurality of second active regions ACT2 are arranged in a row in the second direction Y. In an embodiment, the plurality of first active regions ACT1 and the plurality of second active regions ACT2 are spaced apart from each other in a first direction X.

The first transistor Tr1 or the second transistor Tr2 shown in FIG. 6 may be formed in the plurality of first active regions ACT1, and may correspond to each of the plurality of first active regions ACT1. The third transistor Tr3 or the fourth transistor Tr4 shown in FIG. 6 may be formed in the plurality of second active regions ACT2, and may correspond to each of the plurality of second active regions ACT2. Therefore, the components of the bit line sense amplifier array 120 of FIG. 3 may be disposed in the plurality of first active regions ACT1 and the plurality of second active regions ACT2.

The third active region ACT3 may be disposed in a space IS where the plurality of first active regions ACT1 and the plurality of second active regions ACT2 are spaced apart from each other in the first direction X. One or more of the first NMOS transistor 161a, the second NMOS transistor 161b, the third NMOS transistor 164a, and the fourth NMOS transistor 164b shown in FIG. 6 may be formed in the third active region ACT3. Therefore, the components of the local sense amplifier 160 of FIG. 3 may be disposed in the third active region ACT3.

The plurality of first gate patterns GP1 may include a first-first gate pattern GP1_1 and a first-second gate pattern GP1_2. In an embodiment, the first-first gate pattern GP1_1 and the first-second gate pattern GP1_2 extend in the first direction X on the third active region ACT3 while being spaced apart from each other in the second direction Y. The plurality of first gate patterns GP1 may contain polysilicon or metal, but embodiments of the first gate patterns GP1 are not limited thereto.

A first gate oxide film GOx1 may be disposed between the plurality of first gate patterns GP1 and the third active region ACT3. The plurality of first gate patterns GP1 and the first gate oxide film GOx1 may form one gate structure. In an embodiment, the first gate oxide film GOx1 contacts surfaces of the first gate patterns GP1.

In an embodiment, the second gate pattern GP2 extends in the second direction Y. In an embodiment, the second gate pattern GP2 is not disposed on the third active region ACT3 and does not overlap the third active region ACT3. The second gate pattern GP2 may connect the plurality of first gate patterns GP1 to form one multi-finger gate pattern. In other words, the second gate pattern GP2 connects the first-first gate pattern GP1_1 and the first-second gate pattern GP1_2. With such an arrangement of the second gate pattern GP2 and the plurality of first gate patterns GP1 may operate as the same gate pattern, and the plurality of first gate patterns GP1 and the second gate pattern GP2 may correspond to one of the gate 162a of the first NMOS transistor 161a and the gate 162b of the second NMOS transistor 161b shown in FIG. 6.

The first conductive line CL1 includes a first-first conductive line CL1_1 and a first-second conductive line CL1_2. The first-first conductive line CL1_1 and the first-second conductive line CL1_2 are spaced apart from each other in the second direction Y while extending in the first direction X on the third active region ACT3. The first-first conductive line CL1_1 and the first-second conductive line CL1_2 are disposed between the plurality of first gate patterns GP1 without overlapping each other in a plan view.

In an embodiment, the first conductive line CL1 includes a first conductive region CL1_a and a second conductive region CL1_b. The first conductive region CL1_a may extend in the first direction X on the third active region ACT3, and may include regions of the first-first conductive line CL1_1 and the first-second conductive line CL1_2 that are disposed on the third active region ACT3.

In an embodiment, the second conductive region CL1_b is not disposed on the third active region ACT3 and does not overlap the third active region ACT3. In an embodiment, the second conductive region CL1_b overlaps the second gate pattern GP2 in a plan view and is electrically connected to the second gate pattern GP2 through the second contact DC2. In an embodiment, the second gate pattern GP2 and the substrate 101 are spaced apart from each other in a third direction Z. Although not shown, an interlayer insulating layer may be disposed between the second gate pattern GP2 and the substrate 101 to electrically insulate them.

The first conductive line CL1 may correspond to the conductive line 163 in the local sense amplifier 160 of FIG. 6. The first conductive line CL1 may electrically connect the components in the local sense amplifier 160 of FIG. 6, so that the local sense amplifier 160 may operate.

The second conductive line CL2 may extend across the plurality of first and second active regions ACT1 and ACT2 and the third active region ACT3 in the first direction X. Although at least a part of the second conductive line CL2 may overlap the plurality of first gate patterns GP1 in a plan view, the second conductive line CL2 may be disposed above the plurality of first gate patterns GP1 to be separated therefrom.

The second conductive line CL2 according to an embodiment overlaps gate structures GPa and GOxa disposed on the plurality of first active regions ACT1 and gate structures GPb and GOxb disposed on the plurality of second active regions ACT2 in a plan view, and may be electrically connected to the gate structures GPb and GOxb through contacts DCa and DCb. Therefore, the transistors disposed on the plurality of first active regions ACT1 and the transistors disposed on the plurality of second active regions ACT2 may be electrically connected by the second conductive line CL2. The second conductive line CL2 may correspond to the conductive lines 123a and 123b in the N-type sense amplifier 121a and the P-type sense amplifier 121b of FIG. 6.

In an exemplary embodiment, the second conductive line CL2 and the first conductive line CL1 are formed on a same plane without overlapping each other.

The first contact DC1 includes a first-first contact DC1_1 and a first-second contact DC1_2. In an embodiment, the first-first contact DC1_1 and the first-second contact DC1_2 extend in the first direction X on the third active region ACT3 without overlapping each other, and are spaced apart from each other in the second direction Y.

In an embodiment, the first contact DC1 overlaps the first conductive line CL1 in a plan view. In an embodiment, the first-first contact DC1_1 is in contact with and electrically connected to the first-first conductive line CL1_1 and the third active region ACT3. The region in the third active region ACT3 that is in contact with the first-first contact DC1_1 may correspond to a source/drain region. Similarly, the first-second contact DC1_2 may be in contact with and electrically connected to the first-second conductive line CL1_2 and the third active region ACT3. The region in the third active region ACT3 that is in contact with the first-second contact DC1_2 may correspond to the source/drain region.

Therefore, the second contact DC2, the first plurality of first gate patterns GP1, the second gate pattern GP2, and the third active region ACT3 may form one of the gate 162a of the first NMOS transistor 161a and the gate 162b of the second NMOS transistor 161b in the local sense amplifier 160 of FIG. 6.

In an embodiment, the first contact DC1 has a long side DC1_a and a short side DC1_b extending in the first direction X in a plan view. The long side DC1_a has a first width W1, and the short side DC1_*b* has a second width W2. In an embodiment, the first width W1 is greater than the second width W2.

Although not shown, the interlayer insulating layer may be disposed between the components that are illustrated or described to be separated from each other in FIGS. 7 to 10 to electrically insulate them.

The adjacent active region ACTa may be disposed in the space IS where the plurality of first active regions ACT1 and the plurality of second active regions ACT2 are spaced apart from each other in the first direction X. The adjacent active region ACTa and the third active region ACT3 may be arranged in the second direction Y.

The adjacent active region ACTa may correspond to the third active region ACT3, and the arrangement relationship between the third active region ACT3 and the plurality of first gate patterns GP1, the second gate pattern GP2, the first conductive line CL1, the second conductive line CL2, the first contact DC1, and the second contact DC2 may be applied to the adjacent active region ACTa.

Therefore, the second contact DC2, the plurality of first gate patterns GP1, the second gate pattern GP2, and the adjacent active region ACTa may form the gate structure included in the transistors in the column decoder 130, the input/output (I/O) gate 140, the control logic circuit 150, and the local sense amplifier 160 shown in FIG. 3 adjacent to the bit line sense amplifier 120.

In other words, one of the transistors for driving the column decoder 130, the input/output (I/O) gate 140, the control logic circuit 150, and the local sense amplifier 160 shown in FIG. 3 may be formed in the adjacent active region ACTa.

Figure 11:
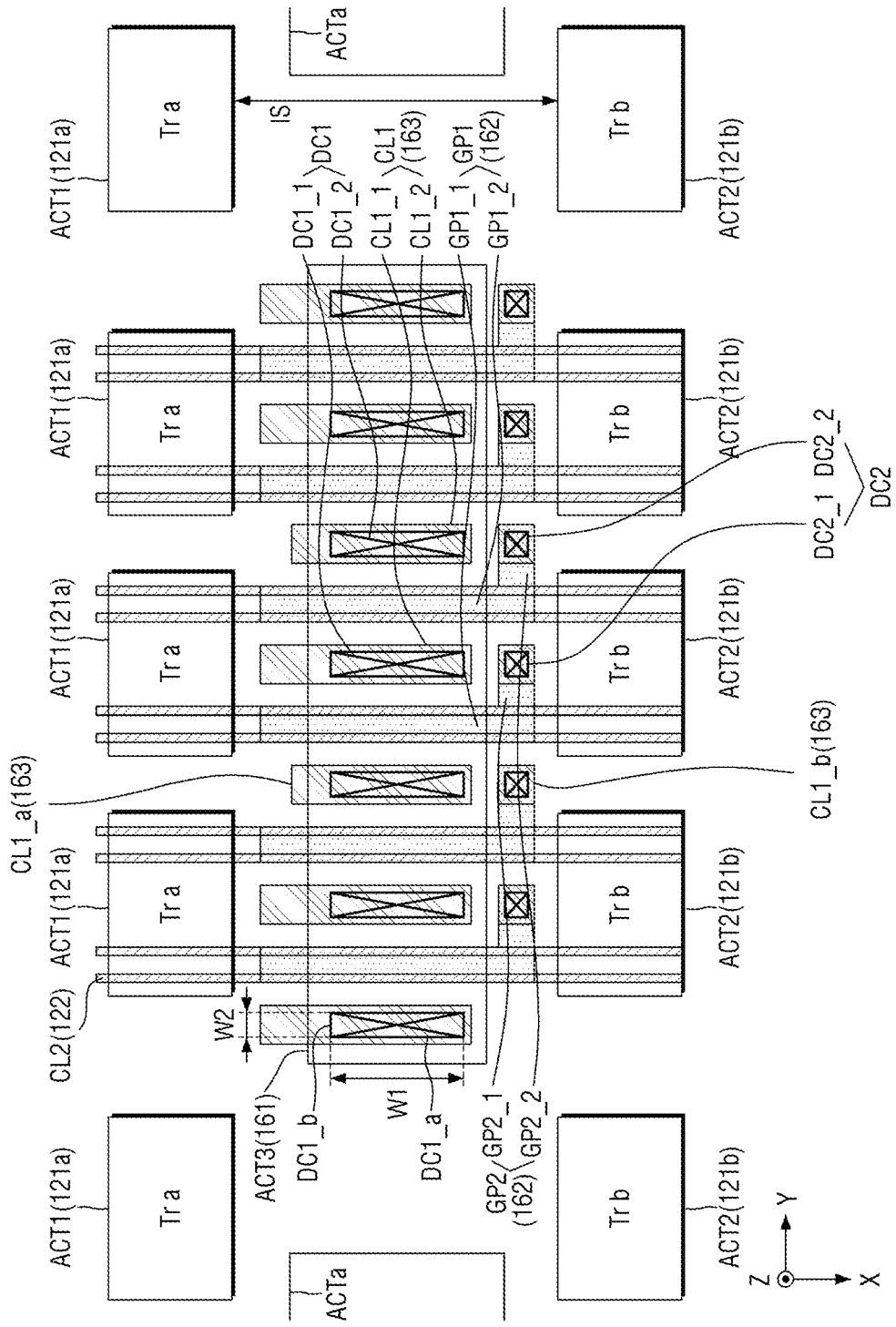
FIG. 11 is a layout diagram illustrating a sense amplifier according to an exemplary embodiment of the present disclosure.

FIG. 11 is a layout diagram illustrating a sense amplifier according to an exemplary embodiment of the present disclosure.

Hereinafter, a sense amplifier according to an embodiment of the present disclosure will be described with reference to FIG. 11. The description will focus mainly on differences from the sense amplifiers shown in FIGS. 7 to 10.

Unlike the sense amplifier shown in FIGS. 7 to 10, in the sense amplifier shown in FIG. 11, the second gate pattern GP2 includes a second-first gate pattern GP2_1 and a second-second gate pattern GP2_2 that are separated from each other without overlapping in a plan view, and the second contact DC2 includes a second-first contact DC2_1 and a second-second contact DC2_2 respectively corresponding to the second-first gate pattern GP2_1 and the second-second gate pattern GP2_2.

In an embodiment, the second-first gate pattern GP2_1 is connected to the first-first gate pattern GP1_1 to form one gate structure, and the second-second gate pattern GP2_2 is connected to the first-second gate pattern GP1_2 to form one gate structure. The second-first gate pattern GP2_1 and the first-first gate pattern GP1_1 form one multi-finger gate pattern, and the second-second gate pattern GP2_2 and the first-second gate pattern GP1_2 form one single finger gate pattern.

The second-first contact DC2_1 electrically connects the second-first gate pattern GP2_1 to the second conductive region CL1_*b*, and the second-second contact DC2_2 electrically connects the second-second gate pattern GP2_2 to the second conductive region CL1_*b*.

Therefore, gate voltages may be independently applied to the second-first gate pattern GP2_1 and the second-second gate pattern GP2_2. However, depending on embodiments, the first-first gate pattern GP1_1 and the first-second gate pattern GP1_2 are disposed in the same third active region ACT3, so that the same gate voltage may be applied through the second-first contact DC2_1 and the second-second contact DC2_2.

Figure 12:
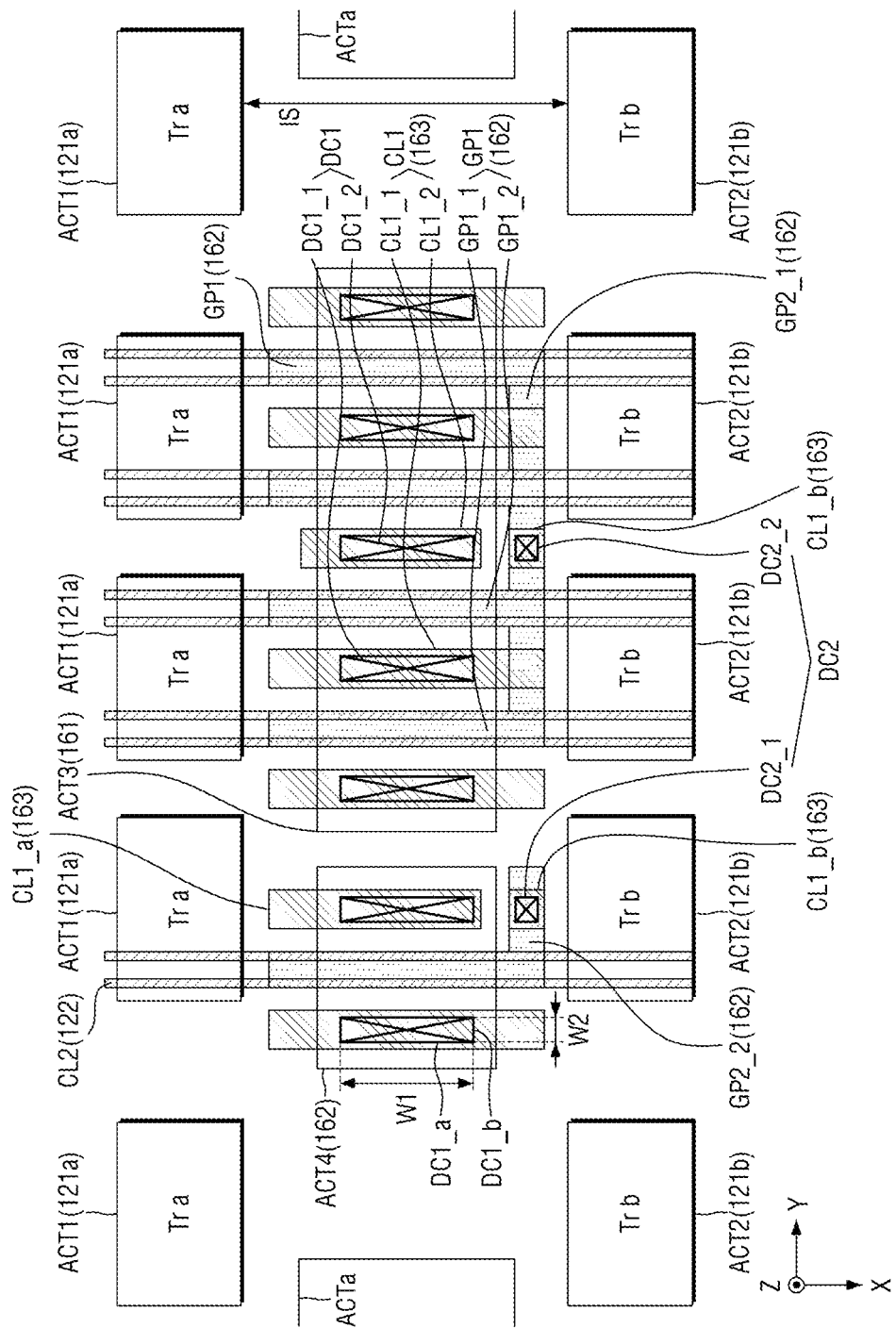
FIG. 12 is a layout diagram illustrating a sense amplifier according to an exemplary embodiment of the present disclosure.

FIG. 12 is a layout diagram illustrating a sense amplifier according to an exemplary embodiment of the present disclosure.

Hereinafter, a sense amplifier according to an exemplary embodiment of the present disclosure will be described with reference to FIG. 12. The differences between the sense amplifier shown in FIGS. 7 to 10 and the sense amplifier shown in FIG. 11 will be mainly described.

Compared to the sense amplifier of FIGS. 7 to 10, the sense amplifier of FIG. 11 further includes a fourth active region ACT4.

The third active region ACT3 may correspond to the third active region ACT3 of FIG. 7, and the fourth active region ACT4 may correspond to the third active region ACT3 of FIG. 11.

The second-first gate pattern GP2_1 extends in the second direction Y. In an embodiment, the second-first gate pattern GP2_1 is not disposed on the third and fourth active regions ACT3 and ACT4 and does not overlap the third and fourth active regions ACT3 and ACT4. The second-first gate pattern GP2_1 may form one multi-finger gate pattern by connecting the plurality of first gate patterns GP1 disposed on the third active region ACT3.

The second-second gate pattern GP2_2 is not disposed on the third and fourth active regions ACT3 and ACT4 and does not overlap the third and fourth active regions ACT3 and ACT4. The second-second gate pattern GP2_2 may be connected to the first gate pattern GP1 disposed on the third active region ACT4 to form one single finger gate pattern.

The second-first contact DC2_1 electrically connects the second-first gate pattern GP2_1 to the second conductive region CL1_*b*, and the second-second contact DC2_2 electrically connects the second-second gate pattern GP2_2 to the second conductive region CL1_*b*.

Gate voltages may be independently applied to the second-first gate pattern GP2_1 and the second-second gate pattern GP2_2. The third and fourth active regions ACT3 and ACT4 may operate as separate transistors.

Figure 13:
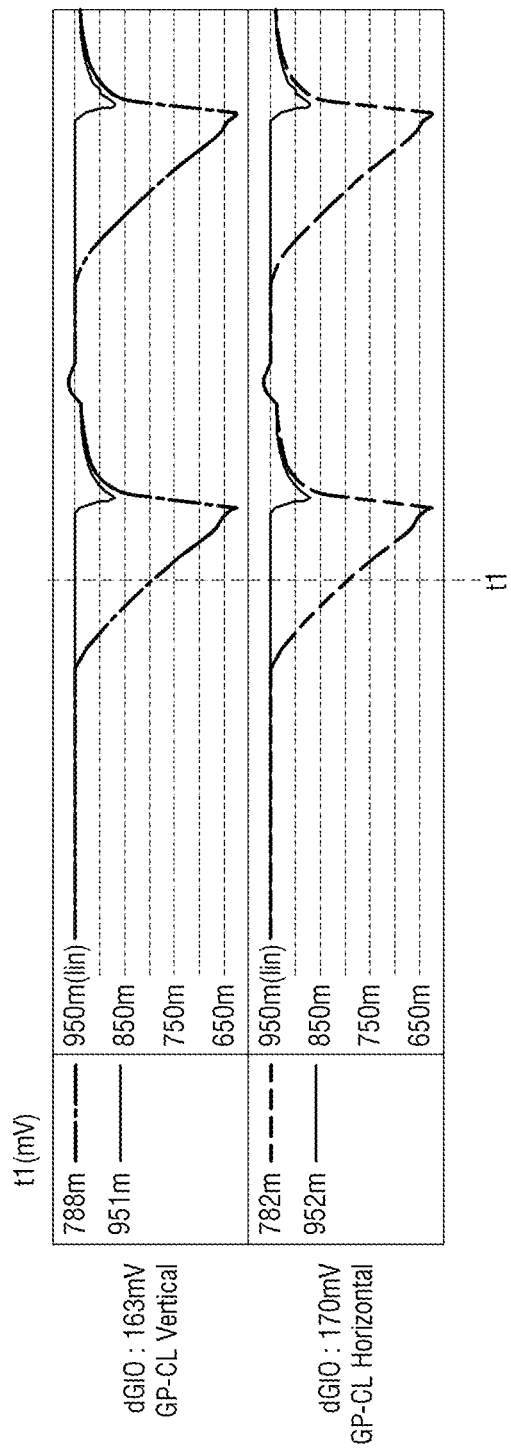
FIG. 13 is a diagram for explaining the effect of a sense amplifier according to an exemplary embodiment of the present disclosure.

FIG. 13 is a diagram for explaining the effect of a sense amplifier according to an embodiment of the present disclosure.

Referring to FIGS. 7 and 13, in the active region included in the local sense amplifier 160, the first gate pattern GP1 and the second conductive line CL2 extend in the first direction X and overlap each other in a plan view. Therefore, the area where the first contacts DC1 are disposed in the active region may be increased.

The first contact DC1 may have a long side DC1_*a* extending in the first direction X in a plan view.

Therefore, when the first gate pattern GP1 and the second conductive line CL2 extend in parallel (horizontally), the width of the first gate pattern GP1 in the third active region ACT3, which is determined by the short side Wb of the third active region ACT3, may be relatively smaller than that when the first gate pattern GP1 and the second conductive line CL2 intersect vertically. Since, however, the area of the first contact DC in the active region is increased, the potential difference dGIO of the global input/output line pair GIO may be 170 mV at a first time t1 during the operation of the semiconductor memory device 100.

When the first gate pattern GP1 and the second conductive line CL2 intersect vertically, the width of the first gate pattern GP1 in the third active region ACT3, which is determined by the long side Wa of the third active region ACT3, may be relatively greater than that when the first gate pattern GP1 and the second conductive line CL2 extend in parallel (horizontally). Since, however, the area of the first contact DC1 in the active region is reduced, the potential difference dGIO of the global input/output line pair GIO becomes 163 mV at the first time t1 during the operation of the semiconductor memory device 100.

When the contact area is increased by the parallel (horizontal) arrangement of the first gate pattern GP1 and the second conductive line CL2 in an embodiment of the present disclosure, the amount of current moving through the contact increases. Accordingly, characteristics of the transistor are improved, and the data sensing margin of the global input/output line may be increased. Further, the potential difference of the global input/output line quickly reaches a constant value, so that the timing of the read operation may be advanced.

In some instances, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made in the embodiments without departing from the spirit and scope of the present invention.

What is claimed is:

1. A sense amplifier comprising:
a bit line sense amplifier comprising a first transistor and a second transistor spaced apart from each other in a first direction;
a second conductive line configured to electrically connect the first transistor to the second transistor and extending in the first direction; and
a local sense amplifier configured to at least partially overlap the second conductive line and disposed between the first transistor and the second transistor, wherein the local sense amplifier comprises:
an active region;
a plurality of gate patterns at least partially extending in the first direction and disposed on the active region;
a first contact disposed between the plurality of gate patterns and comprising a long side extending in the first direction and a short side extending in a second direction crossing the first direction; and
a first conductive line electrically connected to the first contact while overlapping the first contact in a plan view and comprising a first conductive region extending in the first direction,
wherein the long side has a first width in the first direction, the short side has a second width in the second direction, and the first width is longer than the second width.

2. The sense amplifier of claim 1, wherein the first contact comprises a first-first contact and a first-second contact that do not overlap each other, and the first conductive line comprises a first-first conductive line at least partially overlapping the first-first contact and a first-second conductive line at least partially overlapping the first-second contact.

3. The sense amplifier of claim 1, wherein the first contact and the plurality of gate patterns form one local sense amplifier transistor.

4. The sense amplifier of claim 1, wherein at least a part of the second conductive line overlaps the plurality of gate patterns in a plan view.

5. The sense amplifier of claim 4, wherein the second conductive line is separated from the plurality of gate patterns.

6. The sense amplifier of claim 1, wherein the first conductive line and the second conductive line are located on a same plane without overlapping each other.

7. The sense amplifier of claim 1, wherein the plurality of gate patterns comprise:
a first gate pattern extending in the first direction while being disposed on the active region and comprising a first-first gate pattern and a first-second gate pattern without overlapping each other in a plan view; and
a second gate pattern extending in the second direction without being disposed on the active region.

8. The sense amplifier of claim 7, further comprising a second contact electrically connected to the first-first gate pattern and the first-second gate pattern while overlapping the second gate pattern in a plan view.

9. The sense amplifier of claim 7, wherein the plurality of gate patterns are connected through the second gate pattern to form one multi-finger gate pattern.

10. The sense amplifier of claim 7, wherein the second gate pattern comprises a second-first gate pattern and a second-second gate pattern separated from each other without overlapping each other, the second-first gate pattern is electrically connected to the first-first gate pattern, and the second-second gate pattern is electrically connected to the first-second gate pattern.

11. A semiconductor memory device comprising:
a memory cell array comprising a plurality of memory cells;
a bit line sense amplifier comprising a first transistor and a second transistor configured to sense a potential difference between a bit line and a complementary bit line during a sensing operation for the plurality of memory cells;
an active region crossed by a second conductive line electrically connecting the first transistor to the second transistor, the active region being separated from a first active of the first transistor and a second active of the second transistor;
a gate pattern at least partially overlapping the second conductive line in a plan view and extending in a first direction in which the second conductive line extends;
a first conductive line extending in the first direction without at least partially overlapping the gate pattern and the second conductive line; and
a first contact electrically connected to the first conductive line and overlapping the first conductive line in a plan view and comprising a long side extending in the first direction and a short side extending in a second direction crossing the first direction,
wherein the long side has a first width in the first direction, the short side has a second width in the second direction, and the first width is longer than the second width.

12. The semiconductor memory device of claim 11, wherein the gate pattern comprises a first gate pattern and a second gate pattern spaced apart in the second direction without overlapping each other, and the first contact is disposed between the first gate pattern and the second gate pattern.

13. The semiconductor memory device of claim 12, wherein the first contact, the first gate pattern, and the second gate pattern form one local sense amplifier transistor.

14. The semiconductor memory device of claim 11, wherein the first conductive line and the second conductive line are located on a same plane without overlapping each other.

15. A semiconductor memory device comprising:
- a memory cell array comprising a plurality of memory cells configured to store data;
- a bit line sense amplifier comprising a first transistor and a second transistor configured to sense a potential difference between a first potential of a bit line and a second potential of a complementary bit line during a sensing operation for the plurality of memory cells;
- a local sense amplifier configured to receive the first potential and the second potential from the bit line sense amplifier and provide data to a global input/output line, the local sense amplifier being disposed between the first transistor and the second transistor, wherein the local sense amplifier comprises:
- an active region;
- a plurality of gate patterns disposed on the active region so as to at least partially overlap a second conductive line electrically connecting the first transistor to the second transistor;
- a first contact disposed between the plurality of gate patterns and comprising a long side extending in a first direction in which the second conductive line extends and a short side extending in a second direction crossing the first direction; and
- a first conductive line electrically connected to the first contact while overlapping the first contact in a plan view and comprising a first conductive region extending in the first direction, wherein the long side has a first width in the first direction, the short side has a second width in the second direction, and the first width is longer than the second width.

16. The semiconductor memory device of claim 15, further comprising:
- a first column select transistor configured to transfer the first potential to the local sense amplifier in response to a column select signal; and
- a second column select gate configured to transfer the second potential to the local sense amplifier in response to the column select signal.

17. The semiconductor memory device of claim 15, wherein the second conductive line is separated from the plurality of gate patterns.

* * * * *